United States Patent [19]
Mou

[11] Patent Number: 5,973,510
[45] Date of Patent: Oct. 26, 1999

[54] I/O INTERFACE FOR MULTILEVEL CIRCUITS

[75] Inventor: Ya-Nan Mou, Hsinchu, Taiwan

[73] Assignee: United Microelectronics Corp., Hsinchu, Taiwan

[21] Appl. No.: 09/059,685

[22] Filed: Apr. 14, 1998

[51] Int. Cl.$^6$ .................................................. H03K 19/175
[52] U.S. Cl. ................................................ 326/81; 326/83
[58] Field of Search ................................. 326/56, 57, 58, 326/62, 68, 80, 81, 83, 121

[56] References Cited

U.S. PATENT DOCUMENTS 5,861,763   1/1999   Vo ................................................ 326/71
5,894,238   4/1999   Chien ........................................ 327/112

Primary Examiner—Michael Tokar
Assistant Examiner—A. Tran

[57] ABSTRACT

The input and output interface in the present invention can includes following components. A first circuit and a second circuit are placed. Means for switching a coupling between the two circuits is used. Grounding means is employed for setting the first terminal to a ground connection. Triggering means is used for triggering the grounding means and the switching means. The method for interfacing input and output between a first circuit and a second circuit includes the steps as follows. At first, an output disable signal of the first circuit is detected. Then a first terminal is isolated from a second terminal. The first terminal is an input and output terminal of the first circuit and the second terminal is an input and output terminal of the second circuit. Next, the first terminal is grounded. The first terminal is then floated. Finally, the first terminal and the second terminal is coupled for the first circuit to receive an output signal from the second circuit.

17 Claims, 4 Drawing Sheets

I/O INTERFACE FOR MULTILEVEL CIRCUITS

FIELD OF THE INVENTION

The present invention relates to input and output interface in the electrical circuit applications, and more specifically to a method and a device for interfacing input and output terminals of circuits with different operating voltages.

BACKGROUND OF THE INVENTION

With the progress of the IC (integrated circuits) industry into the ULSI (ultra large scale integration) stage, the feature size on the semiconductor chip becomes much smaller. The devices on the circuits are narrowed and densely arranged for downsizing the volume and weight of the complicate circuits for various kinds of applications. The operational speed of the circuits is raised at the same time with the smaller and faster devices.

With more and more applications of semiconductors chips on portable devices like cellular phones and laptop computers, the power consumption of the circuits must be reduced. Thus the system can operate with longer time under limited battery capacity. Besides, all the circuits on the system like computers and all kinds of controlling module on electronics are specified to operate at lower power with lower heat generation under high speed. The operating voltage level of the circuits start to decrease for providing more economical operation with low heat generation. For example, lots of circuits or logic circuits used to operate at a voltage of about 5 volts are now operates with a lower voltage, like 3.3 volts.

However, the scaling down of operating voltage cause the interfacing problems between circuits. Since not all the circuits are operated at the same low voltage level, the various circuits or chips of a system may operate at different voltage levels for various functional applications. The system must be operated by communicating signals between all the functional circuits. The input and output signals are not allowed to transfer directly without shifting in the reference voltage level for each circuit. A low voltage operated circuit can be damaged by driving with a high voltage signal. A high voltage operated circuits would operate improperly if it is driven by a low voltage signal. Thus an interface or an interface circuit must be provided for transforming between the input and output signals with distinct voltage levels.

Without limiting the application of the present invention, interface circuits for a 3.3 volts circuit and for a 5 volts circuits are taken for illustration. Turning to FIG. 1, a resistor R1 is used between a pad 10 of a first circuit 12 and a pad 14 of a second circuit 16. In the example, the first circuit 12 is operated at 3.3 volts and the second circuit 16 is operated at 5 volts. The resistor R1 is used to reduce the voltage level of the output signal from the second circuit 16. By selecting an appropriate resistance of R1, a voltage division can be achieved to provide the node 12a a voltage level of about 3.3 V, namely the operational level of the first circuit 12, when the signal from the second circuit 16 is at a high state. Thus the off state in the transistor M1 can be maintained with reduced voltage at node 12a under high voltage input.

However, additional resistor R1 are needed for the interface between each pair of the I/O (input and output) pins. The number of components needed can be great for a system with hundreds of connecting pins between the circuits. Additional components are needed and the manufacture of the circuits or the system is further complicated. Moreover, the addition of the resistors forms additional loads to each pin connection. The exchanging rate of the signals is significantly damaged since every change in the signal must drive the additional resistor before reaching another circuit. The selection on the resistance of the resistor is also very challenging. The loading condition of each pin must be considered. The speed is decreased and the reliability of the system is influenced.

Referring to FIG. 2, another prior art interface device is illustrated. Between the connection of the pad 18 of the first circuit 20 and the pad 22 of the second circuit 24, a resistor R2 is added for pulling up the voltage of node 26. However, the same problem still exist in adding an extra component of resistor R2. The signal exchanging rate is also quite limited by driving time needed through the resistor R2. The design further consumes more power by providing the resistor R2 with a DC power.

SUMMARY OF THE INVENTION

A method and a device for interfacing input and output terminals of circuits with different operating voltages is proposed in the present invention. The method can be applied for providing high speed signal exchange. The interface device can be incorporated within the circuit chip and the need for extra components can be eliminated. Thus low power and high speed signal transfer between the circuits can be achieved.

The input and output interface in the present invention can includes following components. A first circuit having a first terminal of input and output and a second circuit having a second terminal of input and output are placed. Means for switching a coupling between the first terminal and the second terminal is used. Grounding means is employed for setting the first terminal to a ground connection. Triggering means is used to be responsive to an output disable signal of the first circuit for triggering the grounding means and the switching means to isolate the first terminal from the second terminal.

The method for interfacing input and output between a first circuit and a second circuit includes the steps as follows. At first, an output disable signal of the first circuit is detected. Then a first terminal is isolated from a second terminal. The first terminal is an input and output terminal of the first circuit and the second terminal is an input and output terminal of the second circuit. Next, the first terminal is grounded. The first terminal is then floated. Finally, the first terminal and the second terminal is coupled for the first circuit to receive an output signal from the second circuit.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings as follows.

DETAILED DESCRIPTION OF THE PREFERRED EMBODIMENT

The present invention disclosed a method and a device for interfacing input and output terminals between circuits with different operating voltages. A high speed signal transfer with minimum delay is achieved. The power consumed can be significantly reduced compared with the prior arts. The interface can be integrated into the chip fabrication and thus no extra components is needed. The process of interfacing between circuits is simplified. The need for additional power supply connection is also erased.

Figure 1:
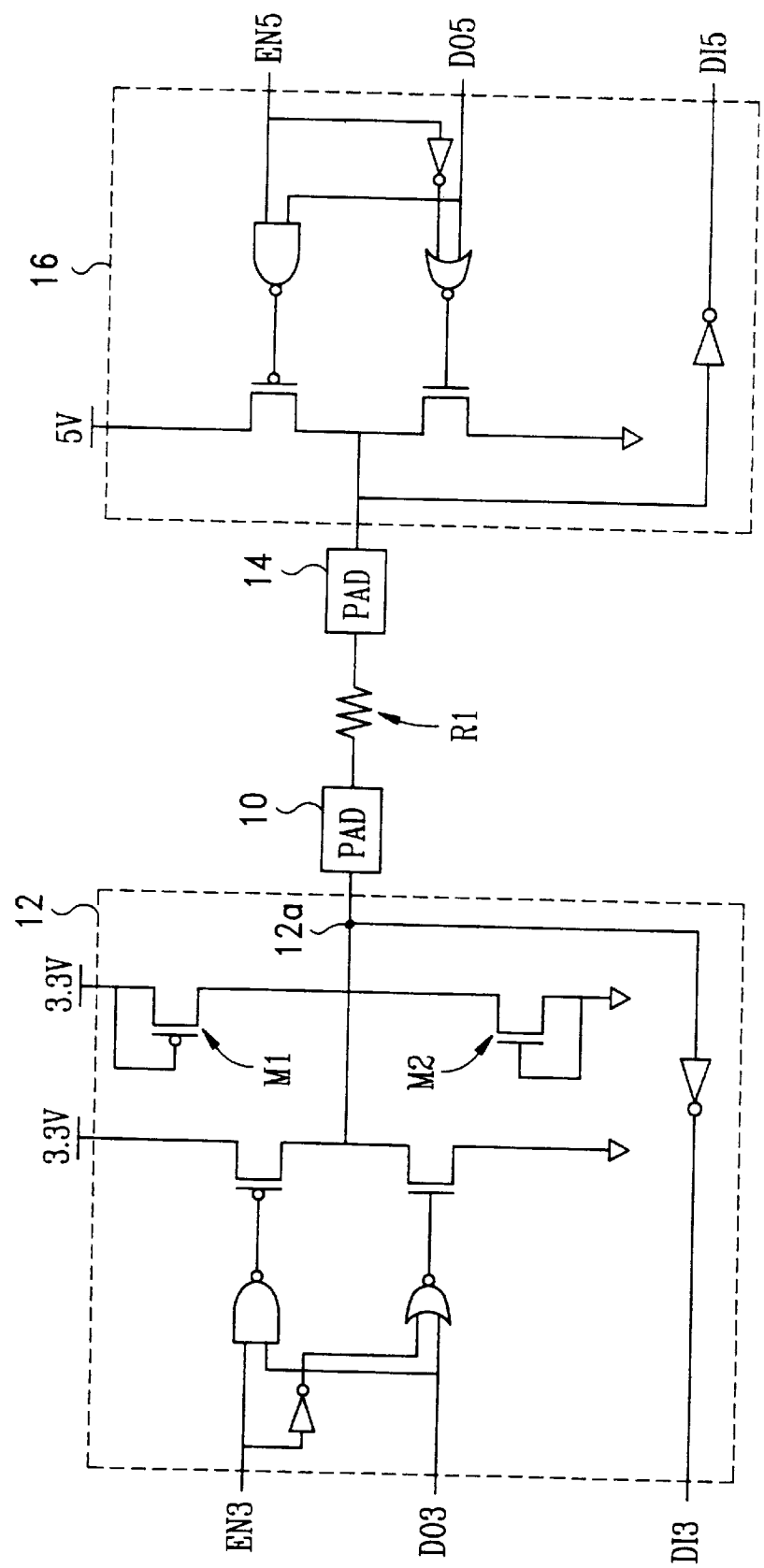
FIG. 1 illustrates a prior art interface between a first circuit and a second circuit.
Figure 2:
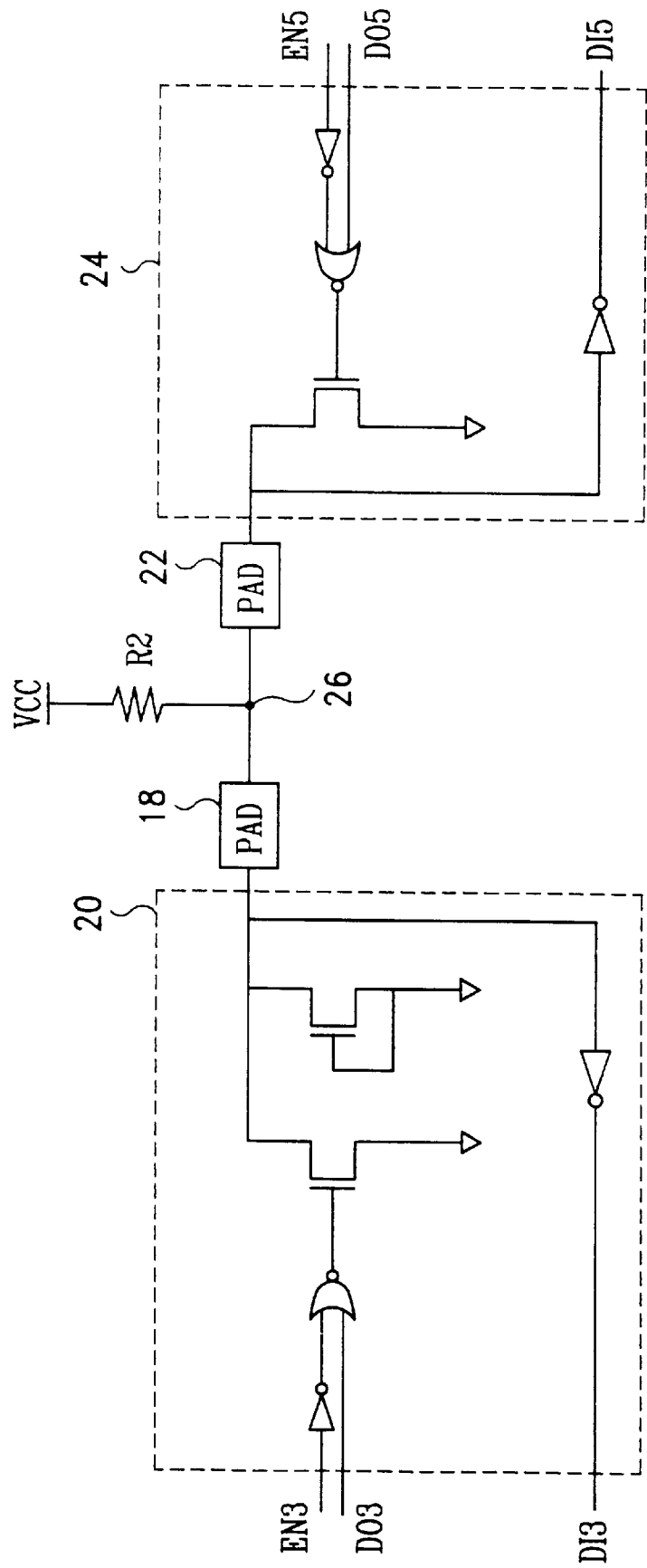
FIG. 2 illustrates another prior art interface between a first circuit and a second circuit.
Figure 3:
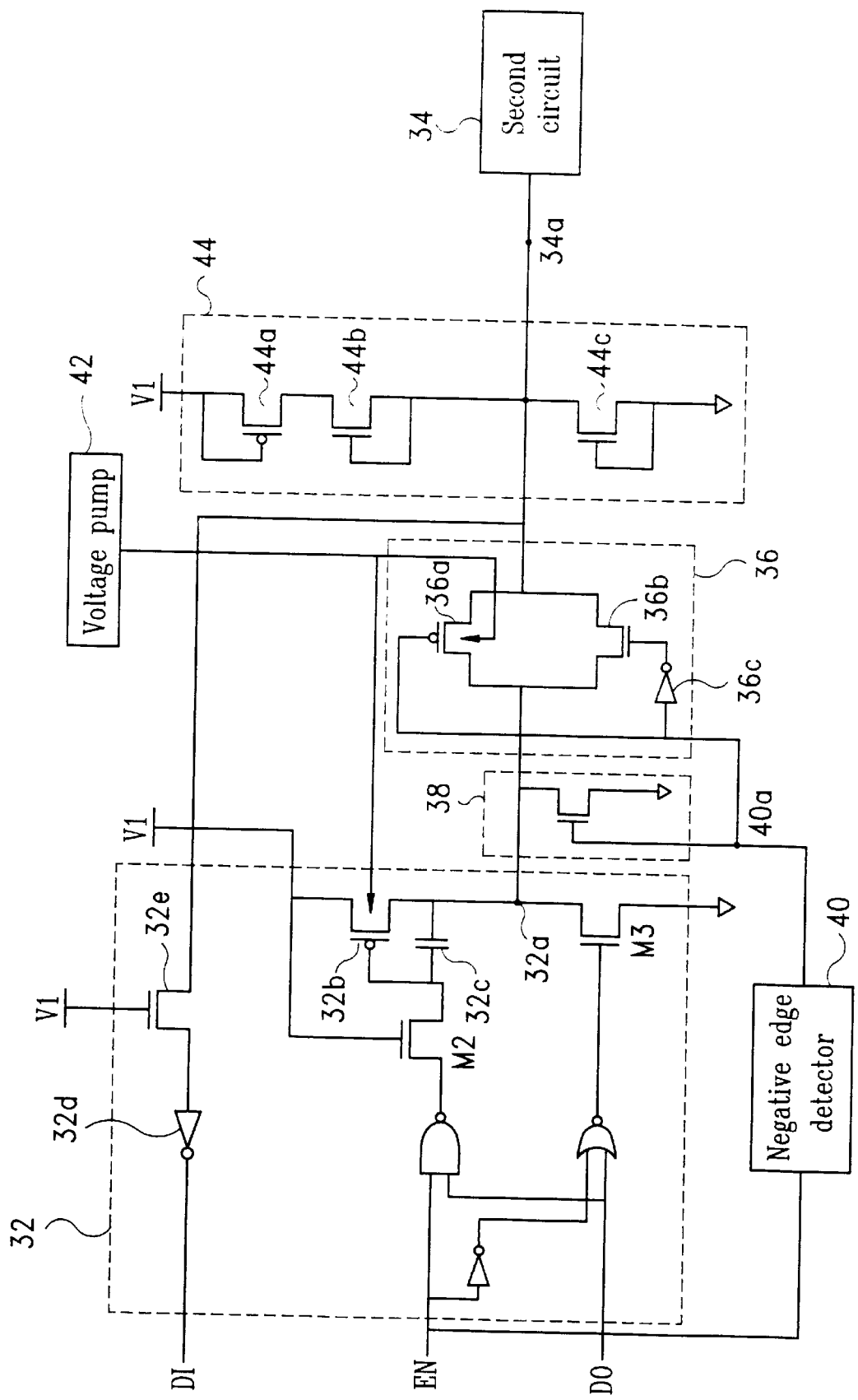
FIG. 3 illustrates an interface application in accordance with the present invention.

Turning to FIG. 3, the input and output interface 30 of the present invention is illustrated. In general, the interface 30 includes a first circuit 32, a second circuit 34, switching means 36, grounding means 38, and triggering means 40.

The first circuit 32 has a first terminal 32a of input and output and the second circuit 34 has a second terminal 34a of input and output. In the case, the first circuit 32 is operated at a lower voltage then the second circuit 34. As an example the first circuit is operated at about 3.3 volts and the second circuit 34 is operated at about 5 volts.

The switching means or a switching circuit 36 is employed for switching a coupling between the first terminal 32a and the second terminal 34a. In the case, the switching circuit 36 includes a PMOS 36a, a NMOS 36b, and an inverter 36c. The PMOS 36a and the NMOS 36b can be triggered to turn off with a triggering pulse at node 40a to isolate the first terminal 32a from the second terminal 34a. The NMOS 36b is triggered off by inverting the triggering pulse through the inverter 36c. The first terminal 32a and the second terminal 34a are then coupled again after the triggering pulse.

The grounding means or a grounding device 38 is employed for setting the first terminal 32a to a ground connection by the triggering pulse. The grounding device 38 can be a NMOS with one end connected with a ground. The NMOS sets the first terminal 32a to ground when the triggering pulse is coupled to the gate of the NMOS.

The triggering means or the triggering circuit 40 is responsive to an output disable signal of the first circuit 32 for triggering the grounding means and the switching means. At an output disable state of the first circuit 32, the voltage level of the enable line EN is pulled down to disable the output. The change in the signal of enable line EN is detected by the triggering circuit 40 and a triggering pulse is generated to the node 40a. Thus the switching circuit 36 can be triggered to isolate the first terminal 32a from the second terminal 34a. The first terminal 32a is also grounded by the grounding device 38. As a preferred embodiment, the triggering circuit 40 can be a negative edge detector which detects the falling of the voltage level on the enable line EN and generates the triggering pulse.

Figure 4:
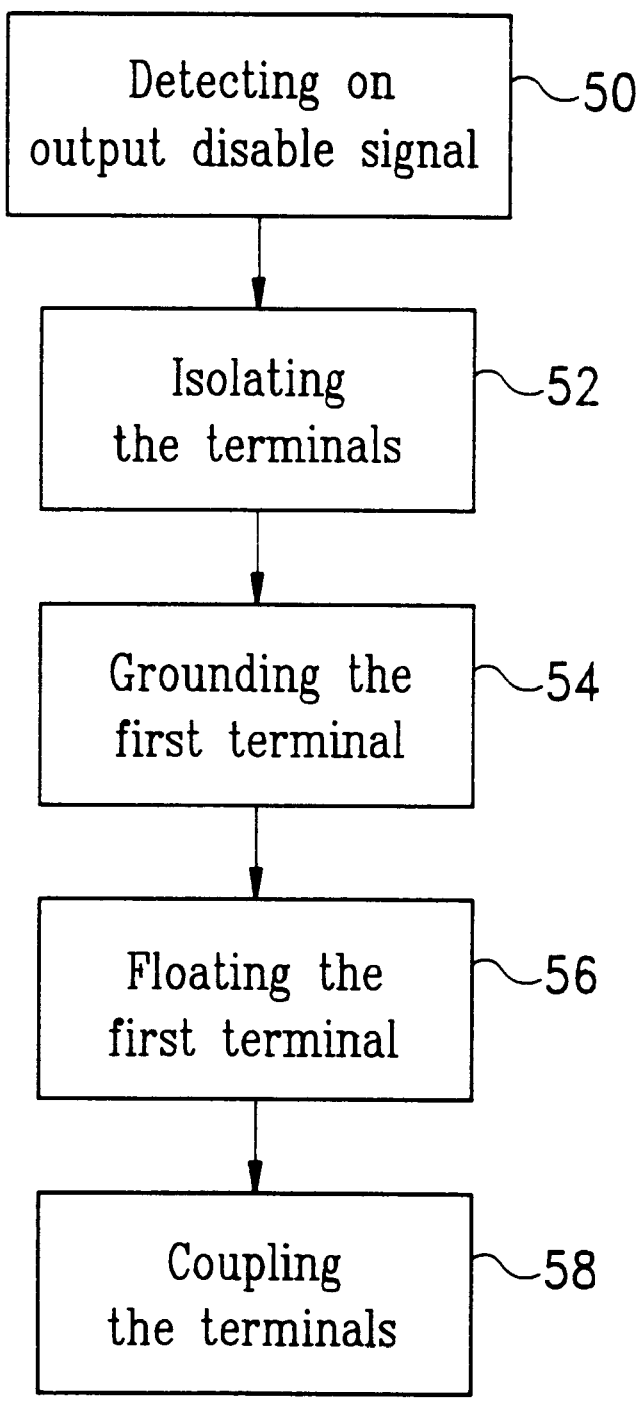
FIG. 4 illustrates a flow diagram of the method for interfacing multilevel circuits in accordance with the present invention.

By referencing the flow diagram in FIG. 4, the method of interfacing is illustrated as follows. For setting the first circuit 32 to receive the signal from the second circuit 34, the voltage level on enable line EN is pulled down as an output disable state. The negative edge detector 40 detects the falling in the level in step 50. Then the first terminal 32a is isolated from the second terminal 34a in the step 52 by the switching circuit 36, with the generation of a triggering pulse by the negative edge detector 40. The first terminal 32a is grounded as well by the grounding device 38 in step 54. After the triggering pulse, the first terminal 32a is floated by the turning off of the grounding device 38 in step 56. In step 58, the first terminal 32a and the second terminal 34a is coupled as well by the switching circuit 36. Then the first circuit 32 is ready for receiving a signal from the second circuit 34.

In addition to the devices identified above, the interface 30 can further includes a voltage pumping means 42, as shown in FIG. 3. The voltage pumping means can be a voltage pump 42. The voltage pump 42 provides the N wells in the switching circuit 36 and the first circuit 32 with an operation voltage of the second circuit 34 which is higher then that of the first circuit 32. Thus junction of the devices like PMOS 36a and 32b in the low voltage side can be prevent from undesired turning on by the high voltage from the second circuit 34.

Besides, the interface 30 can further includes an ESD (electrostatic discharge) protecting circuit 44. The ESD protecting circuit 44 is coupled between the first terminal 32a and the second terminal 34a. The ESD protecting circuit 44 can includes a PMOS 44a and a NMOS 44b connected in series to V1 and one NMOS 44c connected to ground. V1 is the operational voltage of the first circuit 32. Thus any abnormal high voltage from ESD can be bypassed with the PMOS 44a and the NMOS 44b or NMOS 44c without damaging the devices of the interface 30.

It is noticeable that the PMOS 32b in the first circuit must have a capacitor 32c existed between a gate and a drain. The 32c can be an parasitic capacitor which is embedded in the PMOS 32b at the formation. Thus the PMOS 32b can be prevent from turning on when a signal at a high voltage level is inputted by bost strapping the gate of the PMOS 32b. For protecting the gate oxide in the inverter 32d, a NMOS with gate connected to V1 is added to reduce the voltage level of the high voltage signal.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. An input and output interface, said interface comprising:
   a first circuit having a first terminal of input and output;
   a second circuit having a second terminal of input and output;
   means for switching a coupling between said first terminal and said second terminal;
   grounding means for setting said first terminal to a ground connection; and
   triggering means being responsive to an output disable signal of said first circuit for triggering said grounding means and said switching means to isolate said first terminal from said second terminal.

2. The interface of claim 1 further comprising a voltage pumping means for providing N wells in said switching means and said first circuit with an operation voltage of said second circuit.

3. The interface of claim 1 further comprising an ESD (electrostatic discharge) protecting circuit coupled between said first terminal and said second terminal.

4. The interface of claim 1, wherein said first circuit is operated at a voltage lower than said second circuit.

5. The interface of claim 1, wherein said first circuit is operated at about 3.3 volts and said second circuit is operated at about 5 volts.

6. The interface of claim 1, wherein said switching means comprises a PMOS, a NMOS, and an inverter.

7. The interface of claim 1, wherein said grounding means comprises a NMOS with a gate responsive with said triggering means.

8. The interface of claim 1, wherein said triggering means comprises a negative edge detector being responsive with said output disable signal to output a triggering pulse.

9. An input and output interface, said interface comprising:
- a first circuit having a first terminal of input and output;
- a second circuit having a second terminal of input and output;
- a switching circuit for switching a coupling between said first terminal and said second terminal;
- a grounding device for setting said first terminal to a ground connection; and
- a negative edge detector being responsive to an output disable signal of said first circuit to output a triggering pulse, for triggering said grounding means and said switching means to isolate said first terminal from said second terminal.

10. The interface of claim 9 further comprising a voltage pump for providing N wells in said switching circuit and said first circuit with an operation voltage of said second circuit.

11. The interface of claim 9 further comprising an ESD (electrostatic discharge) protecting circuit coupled between said first terminal and said second terminal.

12. The interface of claim 9, wherein said first circuit is operated at about 3.3 volts and said second circuit is operated at about 5 volts.

13. The interface of claim 9, wherein said switching circuit comprises a PMOS, a NMOS, and an inverter.

14. The interface of claim 9, wherein said grounding device is a NMOS with a gate responsive with said triggering circuit.

15. An method for interfacing input and output between a first circuit and a second circuit, said method comprising the steps of:
- detecting an output disable signal of said first circuit;
- isolating a first terminal from a second terminal, said first terminal being an input and output terminal of said first circuit, said second terminal being an input and output terminal of said second circuit;
- grounding said first terminal;
- floating said first terminal; and
- coupling said first terminal and said second terminal for receiving an output signal from said second circuit.

16. The method of claim 15, wherein said first circuit is operated at a voltage lower than said second circuit.

17. The method of claim 15, wherein said first circuit is operated at about 3.3 volts and said second circuit is operated at about 5 volts.

* * * * *